United States Patent

Mantl et al.

[11] Patent Number: 5,250,147
[45] Date of Patent: Oct. 5, 1993

[54] METHOD OF PRODUCING A LAYER SYSTEM AND A LAYER SYSTEM AS PRODUCED THEREBY

[75] Inventors: Siegfried Mantl, Jülich; Helge Bay, Linnich, both of Fed. Rep. of Germany

[73] Assignee: Forschungszentrum Julich GmbH, Julich, Fed. Rep. of Germany

[21] Appl. No.: 866,012

[22] Filed: Apr. 8, 1992

[30] Foreign Application Priority Data

Apr. 23, 1991 [DE] Fed. Rep. of Germany ....... 4113143

[51] Int. Cl.⁵ ............................................. C30B 1/10
[52] U.S. Cl. .................................... 156/603; 156/610;
156/DIG. 64; 148/DIG. 147; 437/200
[58] Field of Search ....... 156/603, 610, 612, DIG. 64;
148/DIG. 147; 437/200

[56] References Cited

U.S. PATENT DOCUMENTS

| | | | |
|---|---|---|---|
| 4,180,596 | 12/1979 | Crowder et al. | 148/DIG. 147 |
| 4,558,507 | 12/1985 | Okabayashi et al. | 148/DIG. 147 |
| 4,570,328 | 2/1986 | Price et al. | 148/DIG. 147 |
| 4,619,038 | 10/1986 | Pintchouski | 148/DIG. 147 |
| 4,707,197 | 11/1987 | Hensel et al. | 437/189 |
| 4,731,318 | 3/1988 | Ruhe et al. | 148/DIG. 147 |

OTHER PUBLICATIONS

Schowalter et al, "Control of Misoriented Grains and Pinholes in $CoS_2$ Grown on Si(Gel)", Journal of Crystal Growth, vol. 111 (1991) pp. 948–956.

Primary Examiner—Robert Kunemund
Attorney, Agent, or Firm—Herbert Dubno

[57] ABSTRACT

An epitaxial growth of a first component of a multilayer stack for use in optical, electro-optical and electronic or magnetic components, e.g. on a silicon wafer, can be formed by depositing a second component in a form in which that second component produces a precipitate or inclusions in the first component which with continued deposition may be partly replaced by a third component so that the precipitate itself is buried in a monocrystalline structure and, after a thermal treatment in which the precipitate coalesces, a buried layer is formed of the second component or a compound thereof with, say, the first component, in that monocrystalline structure.

13 Claims, 3 Drawing Sheets

LAYER SYSTEM BEFORE THERMAL TREATMENT

LAYER SYSTEM AFTER THERMAL TREATMENT

LAYER SYSTEM BEFORE HEAT TREATMENT

LAYER SYSTEM AFTER HEAT TREATMENT

LAYER SYSTEM BEFORE HEAT TREATMENT

LAYER SYSTEM AFTER HEAT TREATMENT

METHOD OF PRODUCING A LAYER SYSTEM AND A LAYER SYSTEM AS PRODUCED THEREBY

FIELD OF THE INVENTION

Our present invention relates to a process or method of producing a layer system for electronic, electro-optical, optical and magnetic components and to a layer structure as thus produced, the layer system or structure being comprised of semiconducting, metallic and/or electrically insulating layers and including at least one monocrystalline layer which can be epitaxially grown.

BACKGROUND OF THE INVENTION

It is known to provide layer systems upon an appropriate substrate, such as a silicon wafer, of materials having electrical, electronic or optical characteristics which enable them to be used for electronic, electro-optical, magnetic and optical components in communications and other systems. The layers generally include at least one semiconducting layer and may be composed of semiconductive, metallic and electrically insulating materials. A stack of layers in such a system can include at least two layers of which one, for example, the lower layer or the one closest to the substrate, may be epitaxially grown and a monocrystalline layer upon which the second layer of the pair is deposited.

To fabricate such layer systems and structures, practically all of the techniques which have been developed heretofore for thin layer fabrication, layer growth and the formation of layer stacks at appropriate temperatures and under well-controlled deposition conditions may be used. In particular, we may mentioned molecular-beam epitaxy (MBE), ultrahigh vacuum evaporative deposition (UHV) and chemical vapor deposition (CVD) techniques.

In the past, however, for the formation of different layers on one another, the approach has been to first deposit one component (on a substrate or upon a previously-formed layer) and then to deposit a discrete layer of the next component so that both components are deposited separately.

This approach results in the formation of a multilayer system with sharply distinguishable layers. When, however, not only the first of these layers, for example, the lowermost layer, is to be composed of a monocrystalline structure, but also the upper layer deposited thereon has to be a monocrystalline layer, grown of the latter on an intermediate layer, which does not have a matched monocrystalline structure, is difficult to achieve, if not impossible.

For example, it has not hitherto been possible to provide a buried monocrystalline silicide of high quality on (100) Si by the mentioned techniques. Overgrowing of Si on the monocrystalline silicide, to provide embedded conductive pathways or special components for electronic or electro-optical purposes has been problematical heretofore.

The formation of buried monocrystalline silicides of relatively good quality, especially upon (100) Si has been achieved heretofore only by means of high-dose implantation techniques (A. E. White, K. T. Short, R. C. Dynes, J. P. Garno and J. M. Gipson, Appl. Phys. Lett. 50 (1987) 95).

Industrially applied methods for producing embedded insulation layers ($SiO_2$ layers in Si) can utilize high-dose implantation of oxygen ions in silicon wafers (K. Izumi, M. Doken and H. Arigoshi, Electron. Lett. 14 (1978) 593). These processes, however, are extremely expensive and cannot avoid relatively high dislocation densities in silicon and other lattice defects resulting from the implantation.

OBJECTS OF THE INVENTION

It is, therefore, the principal object of the present invention to provide a method of producing a layer system or layer structure which is simple and less expensive than earlier systems and which enables components to be utilized in the formation of a layer stack in which a monocrystalline layer is applied to a suitable substrate and upper monocrystalline layers of good quality can be produced even when an intervening layer is an amorphous or nonmonocrystalline layer.

It is also an object of this invention to provide a layer system or structure of high quality, including monocrystalline layers and which can have more than three layers, including stacks of at least four layers in which upper or outer layers of the stack are also high quality monocrystalline layers.

Yet another object of our invention is to provide a method of making a layer structure and an electrical, electro-optical, magnetic or optical component utilizing a layer structure, which has improved economies over earlier systems and whereby drawbacks of such earlier systems, such as a high level of lattice defects, can be avoided.

It is also an object of our invention to provide an improved method of making such structures whereby disadvantages of the prior art systems mentioned previously are obviated.

SUMMARY OF THE INVENTION

These objects are attained, in accordance with the invention, in a process for producing a layer system of at least two layers of semiconducting, metallic or insulating materials, in which a first material component (A) is deposited upon a suitable substrate to form a lowermost monocrystalline layer thereon and thereafter further components are deposited to form further layers each upon a respective previously deposited layer.

According to the invention as to two mutually adjacent layers of which at least one is grown epitaxially to form the epitaxial layer and the other is a component (B) which forms the other layer, the two components are not fully soluble in one another but are deposited together in a transition region. At the deposition temperature, the other component (B) alone or both components (A and B or A, B and C) form a stable or metastable phase and the volume proportion of the other component B is a substoichiometric amount and both components as to their volume concentrations or their concentration gradients at the transition region are so provided that the transition region precipitate in the epitaxial layer forms the stable or metastable phases. In a subsequent heat treatment at a temperature at which a sufficient solubility and diffusion constant of the other component in the epitaxialal phase is established, a diffusive redistribution of the stable phase is effected as a result of which, by coalescence of the precipitate, the separate layers are produced. The layers are subjacent and are constituted one of the epitaxially grown component and the other of the stable phase or a stable phase formed from the metastable phase.

More specifically, the method of the invention can comprise the steps of:

(a) epitaxially growing a layer of a first material upon a substrate to form a monocrystalline structure thereon;

(b) while continuing to deposit the first material on the layer formed in step (a), depositing at a transition region a second material on the layer formed in step (a) where the first and second materials are not mutually soluble and at a temperature at which a dispersed precipitate is formed of a stable or metastable phase in the first material; and (c) thereafter heat treating the phase in the first layer at a temperature sufficient to mobilize the second material in the layer and to impart a sufficiently high diffusion constant to the second material to effect diffusive redistribution of the phase and coalesce the precipitate into a second layer separate from but adjacent the first layer at the transition region and of a composition containing the second material.

The resulting layer structure may have a minimum of three layers and can comprise:
a substrate;
a first monocrystalline layer on the substrate; and
a succession of additional layers on the first monocrystalline layer and including at least one other monocrystalline layer alternating with at least one other layer whereby the monocrystalline layers form odd-numbered ones of the layers counting from the first layer.

A stack of layers may be comprised of:
a substrate; and
a stack of layers on the substrate composed of a material selected from the group which consists of semiconducting, metallic and electrically insulating materials, the stack having odd-numbered monocrystalline layers counting from a first layer on the substrate, from the third layer at least one of two mutually adjacent layers of the stack having a monocrystalline structure configured and an electronic, electro-optical or magnetic component.

According to the invention, therefore, during the deposition and epitaxial growth of one layer, a precipitate of the second component or a compound thereof is formed in the first layer so that, upon subsequent heat treatment, the precipitate coalesce to form in the first layer at a transition region, a second layer. If the deposition of the first material is continued so that a third layer overlies the second layer after the coalescence of the precipitate, that third layer can have a monocrystalline structure matching the monocrystalline structure of the first layer and of extremely high quality. Two layers in contact with one another and thus formed can be applied directly to the substrate so that the first of these can be a monocrystalline layer grown on the substrate, although they can also be applied to other layers on the substrate as, for example, the second and third layers of the stack. For each pair of mutually-contacting layers, therefore, at least one is a monocrystalline-grown layer while the other results from the coalescence of the precipitate and consists generally in part of the respective other component B.

The common deposition of the components is intended to refer to simultaneous deposition as well as deposition of the components alternatingly.

In a three-component system according to the invention, components A, B and C may be used with component C, at least in part replacing component A for the deposition subsequent to the formation of the precipitate, these components at the deposition temperature and the temperature of the subsequent heat treatment being not fully soluble in one another so that at the deposition temperature they form With one another stable or metastable phases, and only the other component B, alone or with one of the components A or C, can form a stable phase in the monocrystalline matrix which can coalesce to constitute the intermediate layer.

The components referred to above can be elements, for example Si or Ge, binary mixed crystalline materials like SiGe, or compound-type semiconductors like GaAs.

Thus the component A can be, for example, Si, the component B can be Co and the component C can again be Si. The layer stack 10 $Si/CoSi_2/Si$ ($A/AB_x/A$) will result. The stack $Si/SiO_2/Si$ ($A/AB_x/A$) form from the components Si and $O_2$ is also possible.

Throughout this application the subscript x may be used to indicate the combining quality, namely, the number of atoms of one element combined with another element in the formation of a compound-type semiconductor or the like.

Other layer systems which may be employed according to the invention include:

Epitaxial silicide in Si, as for example, $CoSi_2$, $NiSi_2$, $CrSi_2$, $FeSi_2$, $IrSi_2$, . . . .

Amorphous insulating layers in Si as, for example, $SiO_2$, $Si_3N_4$ . . . .

Polycrystalline semiconductors in Si as, for example, SiC . . . .

Epitaxial metallization layers in GaAs or InP as, for example, CoAl, NiAl . . . . Metallic systems as, for example, $Ni_3Al$ (c phase) in Ni.

In order to obtain layer systems in which the lowermost layer differs from the layer applied to the intermediate layer, the component A can be partly or completely replaced by the component C during the further epitaxial growth following the deposition of the precipitate as described above.

In this case, component A can be Si, the component B $O_2$ and the component C Ge so that a layer stack $Si/SiO_2/SiGe$ ($A/AB_x/AC$ or $A/AB_x/C$) can result.

By way of example of this system in which A has a mixed crystalline configuration, we refer to the layer system $SiGe_{0.25}/SiO_2/SiGe_{0.25}$.

It is also possible to form the intermediate layer of a component B, for example, $SiO_2$, which does not react with the component A (e.g. Ge). The result is a layer stack $Ge/SiO_2/Ge$ or also $Si/CaF_2/Si$. In these cases, the stable phases are composed of $SiO_2$ or $CaF_2$.

The "other" component B which together with the two components A and C, separately, collectively or alone can form a stable or metastable phase must not be able, however, to grow into a monocrystalline lower layer epitaxially.

At the deposition temperature, the component B forms an inclusion or precipitate which can form the stable or metastable phase without detrimentally affecting the monocrystalline matrix. The structure of the precipitate itself can be monocrystalline, polycrystalline or amorphous.

It has been found to be advantageous for the "other" component B during the deposition to grow through the component A or B, together with A or alone epitaxially.

The next by one removed layer, say the third, fifth . . ., is already in incipient deposition, while the previous layer (second, fourth, . . . ) has not been fully formed or the material of which has not been fully deposited.

This means that not only can a stable or metastable phase be formed which includes material from the monocrystalline lower layer A, for example the phase $AB_x$, but also that a further layer (layer A or C or AC) can be formed as a monocrystalline layer of good quality.

In this manner it is possible to produce a layer system in which between two monocrystalline layers, (A and A, A and C or A and AC), an intermediate layer $AB_x$ or $AC_yB_x$, which can be monocrystalline but also can be polycrystalline or amorphous and which is embedded between the monocrystalline layers. The index y here has a meaning corresponding to that described for x above.

The method of the invention involves the generation and embodying of a precipitate in a monocrystalline matrix which is subsequently transformed by a thermal treatment and by diffusive redistribution of the precipitate until a substantially continuous solid layer is formed therefrom, controlled by the selection of the process parameters.

The temperature used can be selected either in situ in the deposition apparatus or extra situ in a tube furnace or in a rapid-heating furnace (RTP—rapid thermal processing).

Care must be taken that the solubility and diffusion constant of the precipitate in the epitaxial matrix will be sufficient during the time of the thermal treatment to allow the formation of the intermediate layer to proceed to completion. This can be optimized in the selection of the individual component and can be established by pretesting in an empirical manner. For the system $Si/CoSi_2/Si$, the preferred temperature is about 1100° C. and the thermal treatment time is about 30 seconds.

It has been found that the distribution of the precipitate in the epitaxial layer is such that the coalescence takes place in the direction of the layer being formed.

Since within the transition region in the monocrystalline layer of component A (and also AC), a concentration gradient is established in which the larger precipitates grow in the region of higher concentration at the expense of the smaller at the edge (Ostwald ripening). This growth results in a coalescence of the precipitate and, finally in the layer formation by a minimization of the interfacial energy.

The transition region is measured by the diffusion length of the component B which is diffusible in the system. Since precipitates in a matrix are thermodynamically unstable, there is a growth of the precipitates and coalescence and thus a growth of a layer even at a constant concentration and precipitate-size distribution, when the layer thickness of the transition region is held sufficiently small with statistical-size distribution.

As a rule, the volume concentration of the stable or metastable phase should be about 60% of the stoichiometric quantity in the transition region to yield this goal.

It can be advantageous, moreover, to deposit the "other" component B with increasing concentration with respect to the epitaxially-grown layers A or C which increases toward the middle of the transition region. This results in a material transport of the stable or metastable phases in the direction of the highest concentration region. The term "middle" here is not used in a strict geometric sense as a center, but rather as a mean region.

It also can be advantageous to deposit the precipitate so that it is of increasing particle size toward the middle from the epitaxially-grown layer.

In both method variants, a concentration gradient is formed in the monocrystalline matrix that promotes transformation of the precipitate into the layer formed therefrom during the heat-treatment operation.

The concentration profile or the size distribution can be symmetrical or asymmetrical. What is important is that the concentration (density) and particle size of the precipitate in a concentration maximum of the other component B exceeds the percolation threshold prior to and/or during the heat-treatment step. The percolation threshold lies as a rule at about one-half the stoichiometry of the stable or metastable phase. The upper limit is determined by the maximum area (volume) proportion of the precipitate which will allow epitaxial growth of component A (and optionally component C).

It will be self-understood that the total quantity of the stable or metastable phase should be so dimensioned that this amount suffices for formation of the layer.

The formation of increasing or decreasing concentrations of the stable or metastable phase or the generation of increasing or decreasing particle-size distribution of the precipitate can be selectively or collectively obtained by a variation in the deposition temperature or of the deposition rate. Variation of the deposition temperature can serve to generate larger or smaller precipitates. The variation of the deposition rate serves to generate the desired concentration profile.

It has been found that the increase or decrease in size distribution or of the concentration can be effected continuously or in steps (stepwise). The subsequent thermal treatment of the precipitate to form the intermediate layer can depend in part upon the concentration and size distribution as well. For example, the thermal treatment will depend upon the dimensions of the transition region or the duration over which the precipitate was disposed.

It is also possible to dope one or more of the layers during the layer formation, thereby obtaining doped layers as well.

Since the deposition process as described can be repeated and varied upon repetition, multilayer stacks with doubled or otherwise repeated pairs or collections of layers can be produced.

By depositing the layers upon lithographically prestructured specimens, lateral in situ structuring can be obtained, e.g. for gate structures of metal-base transistors.

The process of the invention enables the formation of embedded or buried layers which can be formed as metallic conductor paths, insulating layers or strips, or optical waveguides. In this manner a three-dimensional integration of components is possible.

The process of the invention enables the deposition of layers on large area substrates, for example Si wafers with diameters of 100 to 200 mm. A high-production rate of optical, electronic, electro-optical and magnetic components can thus be achieved with the invention.

We have already indicated that the invention also comprehends a layer system having at least three layers including at least two monocrystalline layers, e.g. monocrystalline Si layers, in which from the second layer, each two mutually-adjacent layers includes a layer of a monocrystalline structure with a dislocation density of a maximum of $10^4$ cm$^{-2}$ and preferably substantially less. This degree of crystallinity can exceed the quality of known SIMOX wafers.

The invention is also applicable to a new type of multilayer system having at least four layers of semiconducting metallic or insulating materials with monocrystalline layers in an odd number sequence. In this multilayer stack, according to the invention, counting from the first layer on the substrate, from the third layer on each two mutually-contacting layers will include a layer of monocrystalline structure (i.e. the third, fifth, etc.). These stacks have been found to be especially effective as electronic, electro-optical, optical or magnetic components.

Examples of electronic components which are especially effectively met with stacks according to the invention are metal-base transistors with buried $CoSi_2$ layers and permeable-base transistors with buried $CoSi_2$ layers, buried ground plane systems in which a $CoSi_2$ layer is buried in Si for ultra high-speed signal transmission via microstrip lines.

An optical component utilizing the principles of the present invention can be a buried mirror, in which a metallic layer is buried, for infrared spectroscopy.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1A:
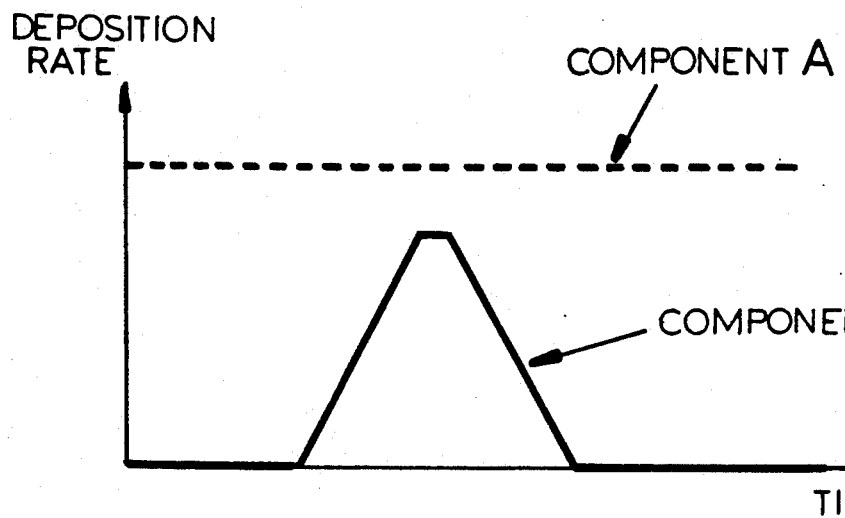
FIGS. 1A, 1B and 1C are, respectively, a graph showing the deposition rate plotted against time, the distribution of the precipitate before the thermal treatment and the layer system after the thermal treatment respectively for one embodiment of the invention.
Figure 1B:
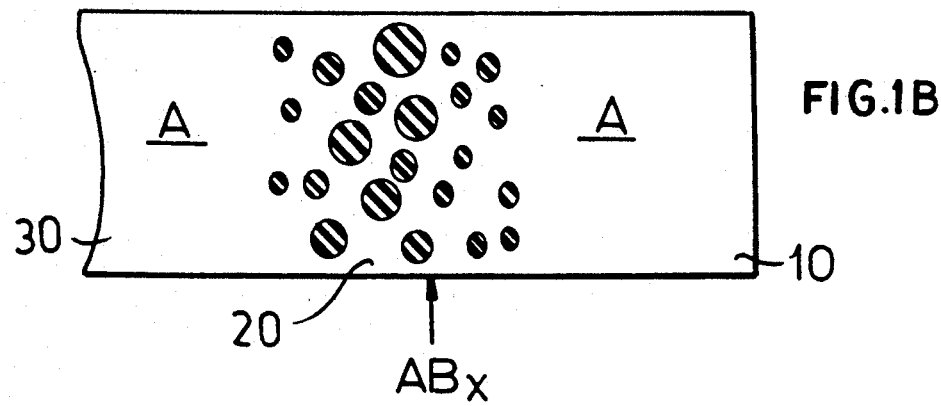
Figure 1C:
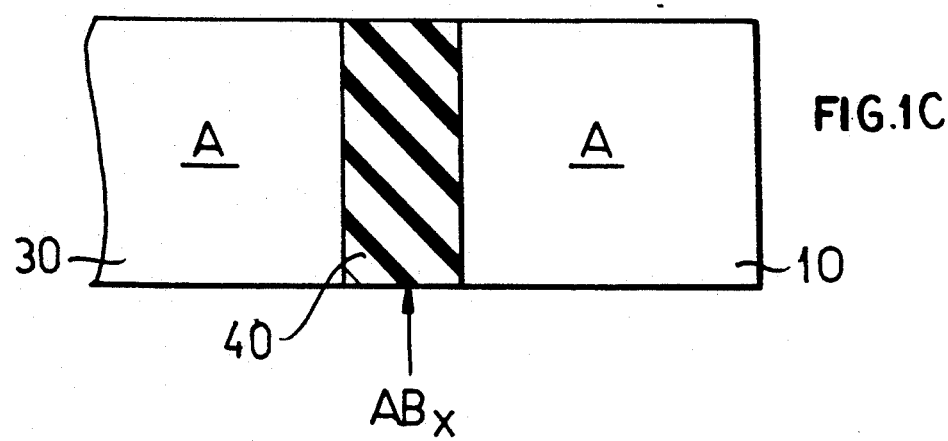
Figure 2A:
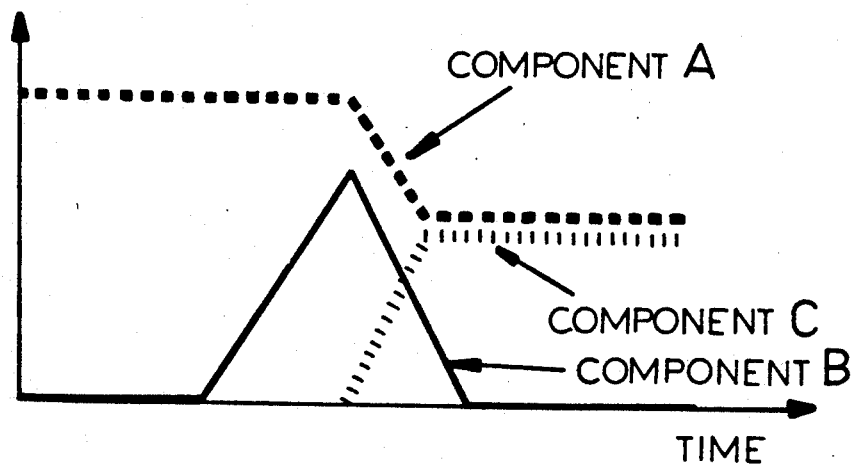
FIGS. 2A, 2B and 2C are views similar to FIGS. 1A-1C for a second embodiment.
Figure 3A:
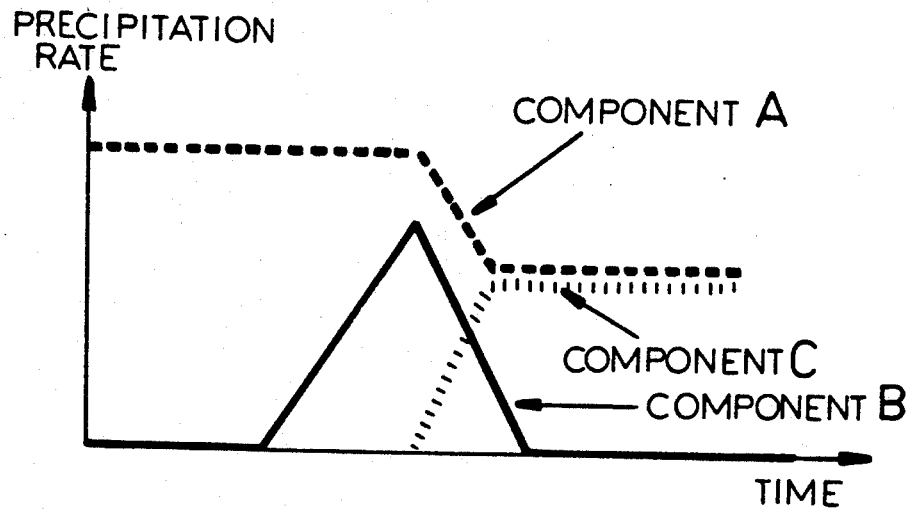
FIGS. 3A, 3B and 3C are diagrams similar to those of FIGS. 1A-1C illustrating a third embodiment of the invention.
Figure 3B:
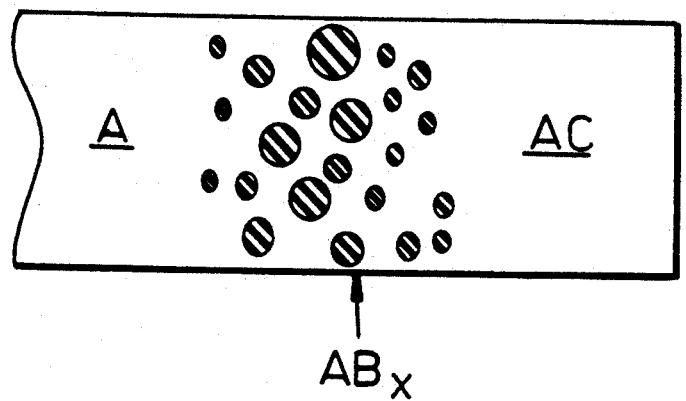
Figure 3C:
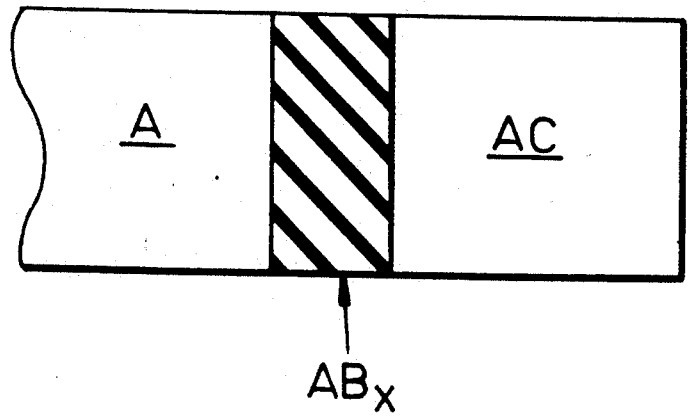

In FIG. 1A, 2A and 3A we show the deposition rate plotted along the ordinate against time plotted along the abscissa for the deposition of two components A and B which in a layer system prior to thermal treatment (FIG. 1B) results in the formation of a monocrystalline deposit A at 10 followed by a precipitate of inclusions $AB_x$ at 20 and then by a further monocrystalline deposit 30 of A. After the thermal treatment (FIG. 1C), an intermediate layer 40 is formed between the layers 10 and 30 by coalescence of the precipitate (see the following examples).

EXAMPLES

The following examples show the formation of layer systems, inter alia, of the types $A/AB_x$, $A/AB_x/A$ and $A/B/AC$.

EXAMPLE 1 (TYPE $A/AB_x/A$)

Production of a monocrystalline cobalt silicide ($CoSi_2$) in (100) or (111) oriented silicon. (Component A=silicon, component B=cobalt, layer $AB_x=CoSi_2$).

After the usual wafer cleaning, in an ultrahigh vacuum apparatus utilizing electron-beam vaporization, silicon is initially deposited on the Si substrate heated to about 500° C. epitaxially at a rate of 0.2 nm/s. While the Si source continues to supply the silicon to the epitaxially-growing matrix, cobalt is evaporated from a second source. The cobalt vaporization rate is so controlled that a triangular cobalt concentration profile is generated as illustrated in FIG. 1A, the cobalt being component B in this system while Component A is silicon.

The maximum cobalt concentration reaches 25% (the theoretical percolation threshold is about half the Co concentration of $CoSi_2$ or 33.3%, i.e. 17%).

For the 100 nm thick $CoSi_2$ layer, the half width of the concentration profile is about 200 nm. This half width and the maximum concentration of the depth profile determines the layer thickness of the silicide following the subsequent thermal treatment step. The transition region extends into the silicon layers sandwiching the intermediate layer between them and encompasses the entire intermediate layer.

At the substrate temperature of 550° C., the deposited cobalt reacts immediately with the silicon and forms the $CoSi_2$ precipitate in the form of inclusions in the deposited Si. The substrate temperature and the evaporation deposition rate determines the precipitate size.

After 60 sec of thermal treatment at 1100° C., a monocrystalline $CoSi_2$ layer is formed at 40 embedded in monocrystalline (100) Si in a $Si/CoSi_2/Si$ structure. The $CoSi_2$ crystallizes in a $CaF_2$ crystalline structure with a lattice mismatch of $-1.2\%$ in Si.

The monocrystallinity of the heterostructure which thus results is of higher quality than earlier systems and is particularly suitable for electronic components. The buried disilicide layer is characterized by a low electrical resistance (about 14 micro-ohm cm at room temperature) and forms a Schottky contact of high quality.

If desired, during the growth of the silicon layer, any doping profile can be generated using a doping element, for example, phosphorous from a vapor deposition source or an effusion cell.

EXAMPLE 2 (TYPE $A/AB_x$)

Component A=Si (100), Component B=$CoSi_2$

The process of Example 1 is followed but is terminated when the deposition reaches the maximum for cobalt. $CoSi_2$ is then formed after the thermal treatment with a surface layer on (100) Si. The layer system is $Si/CoSi_2$.

EXAMPLE 3 (TYPE A/B/A)

Formation of a buried $SiO_2$ layer in monocrystalline Si (SOI silicon on insulator structure).

Component A=Si, Component B=$SiO_2$, intermediate layer=$SiO_2$.

As has been described in Example 1, Si is initially epitaxially deposited on a silicon wafer at the appropriate growth temperature. Thereafter $SiO_2$ is vapor deposited so that a triangular concentration profile (FIG. 1A) is developed with a half width of 100 nm. The $SiO_2$ is distributed in the form of amorphous inclusions in the monocrystalline Si as shown for the inclusions 20 in the Si of layers 10 and 30.

The $SiO_2$ concentration exceeded at the maximum of the profile, a value of approximately 45%.

The monocrystalline Si was covered prior to the thermal treatment with an $SiO_2$ protective layer of a thickness of about 200 nm.

The thermal treatment was effected at a temperature in excess of 1300° C. over a period of 6 hours to yield a layer system $Si/SiO_2/Si$.

The embedded $SiO_2$ layer is a dielectric insulator of high quality. The surface layer of silicon is monocrystalline and has a quality suitable for use in electronic components.

If the $SiO_2$ concentration profile is repeated a number of times at predetermined intervals, a multilayer stack with alternating layers as shown in FIG. 1C is obtained.

EXAMPLE 4 (TYPE A/AB$_x$/A

Production of a buried $SiO_2$ layer in crystalline silicon.

In a modification of Example 3, Si and $SiO_2$ are produced by means of gas-phase epitaxy from $SiH_4$ and $O_2$ in a CVD reactor. Component B is here $O_2$.

EXAMPLE 5 (TYPE A/AB$_x$/AC

Component A=Si, component B=$SiO_2$, component C=Ge.

Production of a layer system having more than two components: epitaxial Si-Ge$_y$ layers with buried $SiO_2$ in (100) Si.

Figure 2B:
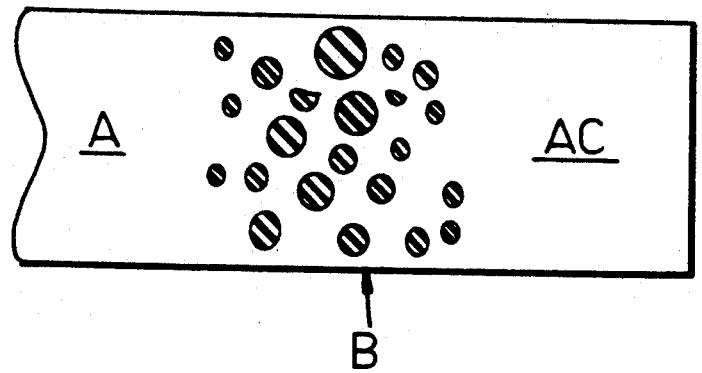
Figure 2C:
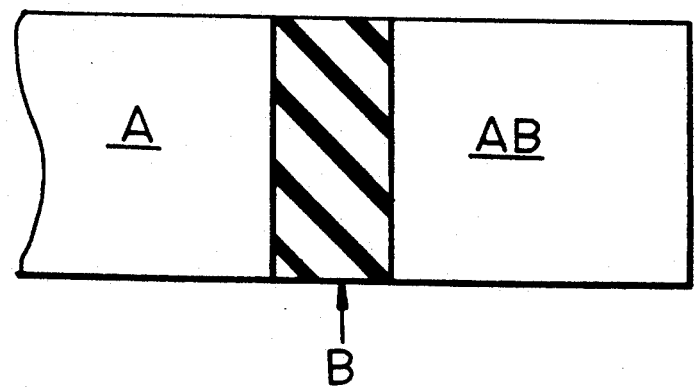

Si and $SiO_2$ are deposited as in Example 3. After the $SiO_2$ concentration maximum is reached, the Si stream is reduced and Ge is codeposited from another source as shown in FIG. 2A. The $SiO_2$ is in the form of inclusions in the silicon phase progressively changing to an Si-Ge phase as can be seen from FIG. 2B. The $SiO_2$ precipitate does not react with Ge. After the thermal treatment, the amorphous $SiO_2$ layer is embedded between monocrystalline Si and the monocrystalline mixed crystal Si-Ge of the desired concentration in a layer system Si/$SiO_2$/-SiGe$_y$, where y=0.25.

We claim:

1. A method of making a multilayer structure including at least one epitaxially grown layer, said method comprising the steps of:
    (a) epitaxially growing a layer of a first material upon a substrate to form a monocrystalline structure thereon;
    (b) while continuing to deposit said first material on the layer formed in step (a), depositing at a transition region a second material on the layer formed in step (a) where said first and second materials are not mutually soluble and at a temperature at which dispersed precipitates are formed of a stable or metastable phase in the first material; and
    (c) thereafter heat treating said phase in said first layer at a temperature sufficient to mobilize said second material in said layer and to impart a sufficiently high diffusion constant to said second material to effect diffusive redistribution of said phase and coalesce said precipitate into a second layer separate from but adjacent said first layer at said transition region and of a composition containing said second material.

2. The method defined in claim 1 wherein, during part of an epitaxially growth of material on said layer of said first material, at least a portion of the epitaxially deposited first material is replaced by a third material intergrowable epitaxially with said first material.

3. The method defined in claim 1 wherein said transition region has a width determined by a diffusion length of the diffusing second material.

4. The method defined in claim 3 wherein the concentration of said second material increases progressively to a center of said transition region.

5. The method defined in claim 3 wherein the precipitate is deposited with progressively increasing size toward a center of said transition region.

6. The method defined in claim 3 wherein a concentration of the precipitate in said first material and the size distribution of the precipitate at the concentration maximum of said second material exceeds the percolation threshold during the heat treatment in step (c).

7. The method defined in claim 1 wherein a concentration of the precipitate in said first material and the size distribution of the precipitate at the concentration maximum of said second material exceeds the percolation threshold prior to the heat treatment in step (c).

8. The method defined in claim 1 wherein a rate of deposition of said first and second materials is varied to generate increasing concentrations of said phase in said first layer.

9. The method defined in claim 1 wherein a rate of deposition of said first and second materials is varied to generate decreasing concentrations of said phase in said first layer.

10. The method defined in claim 1 wherein the deposition of said precipitate in said first layer is varied during its course to change the precipitated particle size distribution continuously over said course of deposition.

11. The method defined in claim 1 wherein the deposition of said precipitate in said first layer is varied during its course to change the concentration of the precipitate in the first layer continuously over said course of deposition.

12. The method defined in claim 1 wherein the deposition of said precipitate in said first layer is varied during its course to change the concentration of the precipitate in the first layer stepwise over said course of deposition.

13. The method defined in claim 1, further comprising the step of depositing at least one doping element in at least one of said layers.

* * * * *